US012609230B2

(12) United States Patent
Wu

(10) Patent No.: US 12,609,230 B2
(45) Date of Patent: Apr. 21, 2026

(54) SEMICONDUCTOR STRUCTURE AND FABRICATION METHOD THEREOF

(71) Applicant: CHANGXIN MEMORY TECHNOLOGIES, INC., Hefei City (CN)

(72) Inventor: Tong Wu, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 994 days.

(21) Appl. No.: 17/662,257

(22) Filed: May 6, 2022

(65) Prior Publication Data

US 2022/0262556 A1     Aug. 18, 2022

Related U.S. Application Data

(63) Continuation of application No. PCT/CN2021/109964, filed on Aug. 2, 2021.

(30) Foreign Application Priority Data

Jan. 14, 2021     (CN) .......................... 202110049102.2

(51) Int. Cl.
*H01F 17/00*          (2006.01)
*H01F 41/02*          (2006.01)
(Continued)

(52) U.S. Cl.
CPC ..... *H01F 17/0033* (2013.01); *H01F 41/0206* (2013.01); *H01L 23/5227* (2013.01); *H10D 1/20* (2025.01)

(58) Field of Classification Search
CPC ... H01F 17/0033; H01F 41/0206; H10D 1/20; H01L 23/5227
See application file for complete search history.

(56) References Cited

U.S. PATENT DOCUMENTS 7,167,073 B2    1/2007  Hatano
7,196,607 B2 *  3/2007  Pleskach ............. H01F 17/0033
                                              336/200

(Continued)

FOREIGN PATENT DOCUMENTS

CN        101740195 A     6/2010
CN        102479685 A     5/2012

(Continued)

OTHER PUBLICATIONS

First Office Action cited in CN202110050743.X, mailed May 10, 2022, 11 pages.

(Continued)

*Primary Examiner* — Malcolm Barnes
(74) *Attorney, Agent, or Firm* — Syncoda LLC; Feng Ma

(57)          ABSTRACT

The present disclosure provides a semiconductor structure and a fabrication method thereof. The semiconductor structure includes: a base, wherein the base is provided with a first surface and a second surface that are opposite to each other; a magnetic core, wherein the magnetic core is located in the base, and an orthographic projection of the magnetic core on the first surface is a closed ring pattern; a dielectric layer, wherein the dielectric layer is located on the second surface; and a solenoid-shaped metal layer, wherein the metal layer is located in the base and the dielectric layer and is wound around the magnetic core; the metal layer is an integrated structure; the metal layer and the magnetic core are spaced apart from each other; part of the metal layer is exposed on the first surface.

7 Claims, 10 Drawing Sheets

(51) Int. Cl.

| | | |
|---|---|---|
| *H01L 23/52* | (2006.01) | |
| *H01L 23/522* | (2006.01) | |
| *H10D 1/20* | (2025.01) | |

(56) References Cited

U.S. PATENT DOCUMENTS

| | | | | |
|---|---|---|---|---|
| 8,072,042 | B1 * | 12/2011 | Kroener | H10D 84/00 |
| | | | | 257/E21.022 |
| 8,754,737 | B2 | 6/2014 | Kin On Sin et al. | |
| 8,884,399 | B2 | 11/2014 | Cheng et al. | |
| 9,514,881 | B2 | 12/2016 | Hong et al. | |
| 10,553,341 | B2 | 2/2020 | Otsubo et al. | |
| 10,923,417 | B2 | 2/2021 | Liao et al. | |
| 2002/0066175 | A1 * | 6/2002 | Huang | H01F 17/0033 |
| | | | | 336/200 |
| 2003/0070282 | A1 * | 4/2003 | Hiatt | H01F 41/34 |
| | | | | 336/213 |
| 2008/0003408 | A1 * | 1/2008 | Masai | H01F 17/0033 |
| | | | | 428/161 |
| 2015/0035638 | A1 * | 2/2015 | Stephanou | H01F 41/041 |
| | | | | 336/200 |
| 2018/0315706 | A1 * | 11/2018 | Liao | H01L 23/5227 |
| 2019/0272936 | A1 * | 9/2019 | Zhang | H01F 27/24 |
| 2019/0333875 | A1 | 10/2019 | Liao et al. | |

FOREIGN PATENT DOCUMENTS

| | | | |
|---|---|---|---|
| CN | 102738128 | A | 10/2012 |
| CN | 102789967 | A | 11/2012 |
| CN | 105336842 | A | 2/2016 |
| CN | 105679488 | A | 6/2016 |
| CN | 103474415 | B | 8/2016 |
| CN | 106463240 | A | 2/2017 |
| CN | 106898458 | A | 6/2017 |
| CN | 108807300 | A | 11/2018 |
| CN | 106340508 | B | 12/2019 |
| CN | 112864135 | A | 5/2021 |
| CN | 112864136 | A | 5/2021 |
| JP | 2005129736 | A | 5/2005 |
| WO | 2015125621 | A1 | 8/2015 |
| WO | 2017119423 | A1 | 7/2017 |

OTHER PUBLICATIONS

International Search Report cited in PCT/CN2021/107613 mailed Oct. 20, 2021, 9 pages.
International Search Report cited in PCT/CN2021/109964 mailed Nov. 3, 2021, 10 pages.
First Office Action and English Translation as cited in CN202110049102. 2, mailed Jan. 12, 2022, 11 pages.

\* cited by examiner

1

SEMICONDUCTOR STRUCTURE AND FABRICATION METHOD THEREOF

CROSS-REFERENCE TO RELATED APPLICATIONS

This is a continuation of International Application No. PCT/CN2021/109964, filed on Aug. 2, 2021, which claims the priority to Chinese Patent Application 202110049102.2, titled "SEMICONDUCTOR STRUCTURE AND FABRICATION METHOD THEREOF" and filed on Jan. 14, 2021. The entire contents of International Application No. PCT/CN2021/109964 and Chinese Patent Application 202110049102.2 are incorporated herein by reference.

TECHNICAL FIELD

The present disclosure relates to, but is not limited to, a semiconductor structure and a fabrication method thereof.

BACKGROUND

Inductor is a basic part of electronic products, and micro-inductor is widely used in radio frequency (RF) micro-electromechanical systems and micro-actuators. The micro-inductor can be used as an energy storage component for the switch mode power supply (SMPS). The miniaturization of the SMPS has become the focus of the development of the next-generation power supplies, namely, power supply in package (PwrSiP) and power supply on chip (PwrSoC). The development direction of PwrSoC is to integrate all power electronic components on one chip to achieve high integration, low cost, high efficiency and high power density. The PwrSoC technology requires the inductor to have a compact physical size, a high current capacity and a high quality factor.

However, with the continuous development of the semiconductor technology, the size of the chip is also continuously reduced, which puts forward higher requirements for the size and electrical performance of the inductor to be integrated on the chip.

SUMMARY

An overview of the subject matter detailed in the present disclosure is provided below, which is not intended to limit the protection scope of the claims.

The present disclosure provides a semiconductor structure and a fabrication method thereof.

A first aspect of the present disclosure provides a semiconductor structure. The semiconductor structure includes: a base, wherein the base is provided with a first surface and a second surface that are opposite to each other; a magnetic core, wherein the magnetic core is located in the base, and an orthographic projection of the magnetic core on the first surface is a closed ring pattern; a dielectric layer, wherein the dielectric layer is located on the second surface; and a solenoid-shaped metal layer, wherein the metal layer is located in the base and the dielectric layer and is wound around the magnetic core; the metal layer and the magnetic core are spaced apart from each other; part of the metal layer is exposed on the first surface; and part of the metal layer is exposed on a surface of the dielectric layer away from the base.

A second aspect of the present disclosure provides a method of fabricating a semiconductor structure. The fabrication method includes: providing a base, wherein the base is provided with a first surface and a second surface that are opposite to each other; the base is provided with a magnetic core therein; an orthographic projection of the magnetic core on the first surface is a closed ring pattern; forming a dielectric layer on the second surface; etching the base and the dielectric layer to form a solenoid-shaped continuous trench, wherein the continuous trench is wound around the magnetic core; the continuous trench and the magnetic core are spaced apart from each other; part of the continuous trench is exposed on the first surface; part of the continuous trench is exposed on a surface of the dielectric layer away from the base; and forming a metal layer in the continuous trench.

Other aspects of the present disclosure are understandable upon reading and understanding of the drawings and detailed description.

BRIEF DESCRIPTION OF THE DRAWINGS

The drawings incorporated into the specification and constituting part of the specification illustrate the embodiments of the present disclosure, and are used together with the description to explain the principles of the embodiments of the present disclosure. In these drawings, similar reference numerals are used to represent similar elements. The drawings in the following description are part rather than all of the embodiments of the present disclosure. Those skilled in the art may derive other drawings based on these drawings without creative efforts.

DETAILED DESCRIPTION

Figure 1:
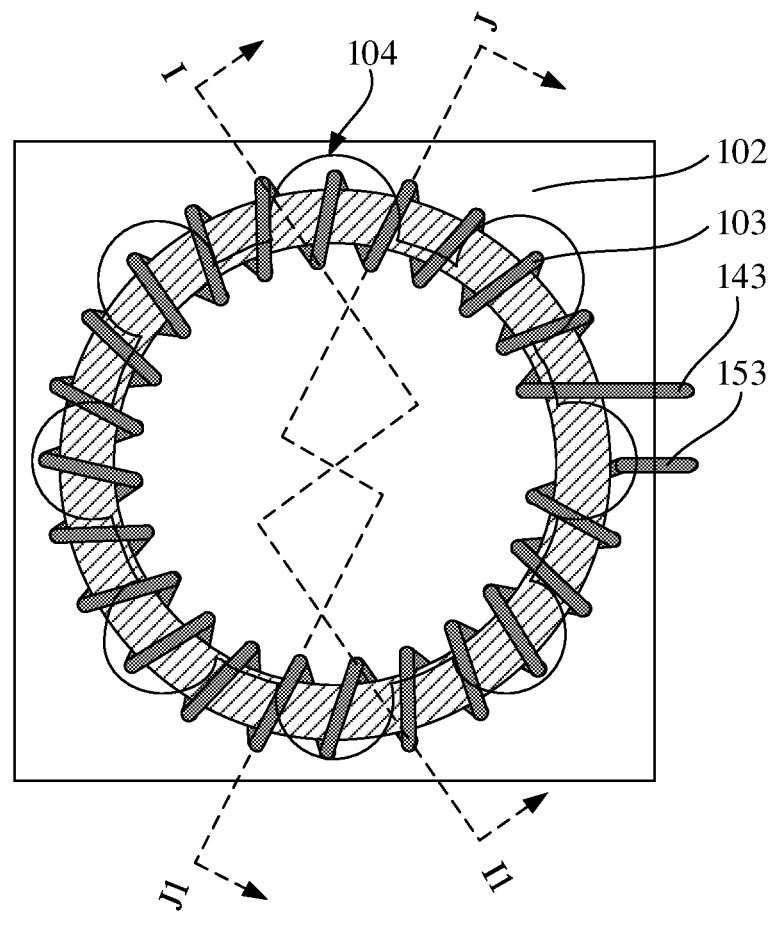
FIG. 1 is a top view of a semiconductor structure according to a first embodiment of the present disclosure.

The technical solutions in the embodiments of the present disclosure are described below clearly and completely with reference to the drawings in the embodiments of the present disclosure. Apparently, the described embodiments are merely part rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

As mentioned in the background, the existing technology puts forward higher requirements on the size and electrical performance of the inductor to be integrated on the chip.

Inductor is a basic power electronic component. In the fabrication process of a power supply on chip (PwrSoC), in order to integrate more power electronic components on the same chip to achieve a higher degree of integration, it is necessary to make the physical size of the inductor more compact while ensuring the good performance of the inductor. At present, the inductor used in the semiconductor structure is usually a planar inductor, which is formed by winding a metal layer on the surface of a substrate or a dielectric layer. In order to improve the electrical performance of the inductor, it is usually necessary to use a highly conductive metal layer with high material cost or increase the thickness of the metal layer to reduce the resistance in the inductor. However, this is not conducive to reducing the fabrication cost of the semiconductor structure and the space occupied by the inductor in the semiconductor structure.

An embodiment of the present disclosure provides a semiconductor structure. In the embodiment, a magnetic core is provided in a base, and an orthographic projection of the magnetic core on a first surface of the base is a closed ring pattern. A metal layer is provided in a dielectric layer on a second surface of the base and in the base, and the metal layer is wound around the magnetic core. In this way, the metal layer and the magnetic core together form a three-dimensional (3D) solenoid inductor in the semiconductor structure, which reduces the orthographic projection area of the solenoid inductor on the surface of the base. Therefore, while the space occupied by the solenoid inductor in the semiconductor structure is reduced, the quality factor of the solenoid inductor is improved by winding the metal layer on the magnetic core, thereby improving the electrical performance and working efficiency of the solenoid inductor. Besides, since part of the metal layer is exposed on the first surface of the base and part of the metal layer is exposed on a surface of the dielectric layer away from the base, part of the metal layer is exposed to the air, thereby ensuring a desirable heat dissipation effect of the solenoid inductor.

Figure 2:
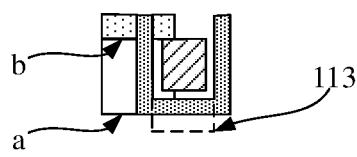
FIG. 2 is a stepped section view along direction II1 in FIG. 1.
Figure 2:
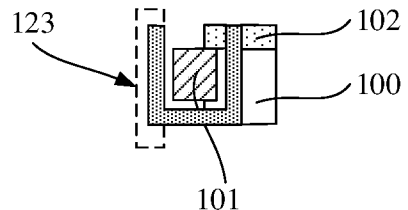
Figure 3:
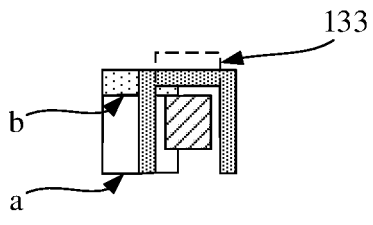
FIG. 3 is a stepped section view along direction JJ1 in FIG. 1.
Figure 3:
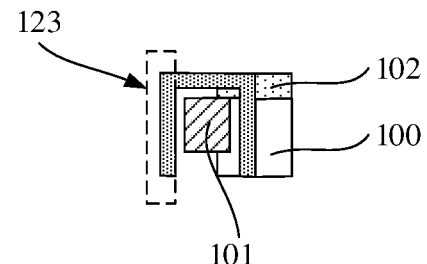
Figure 4:
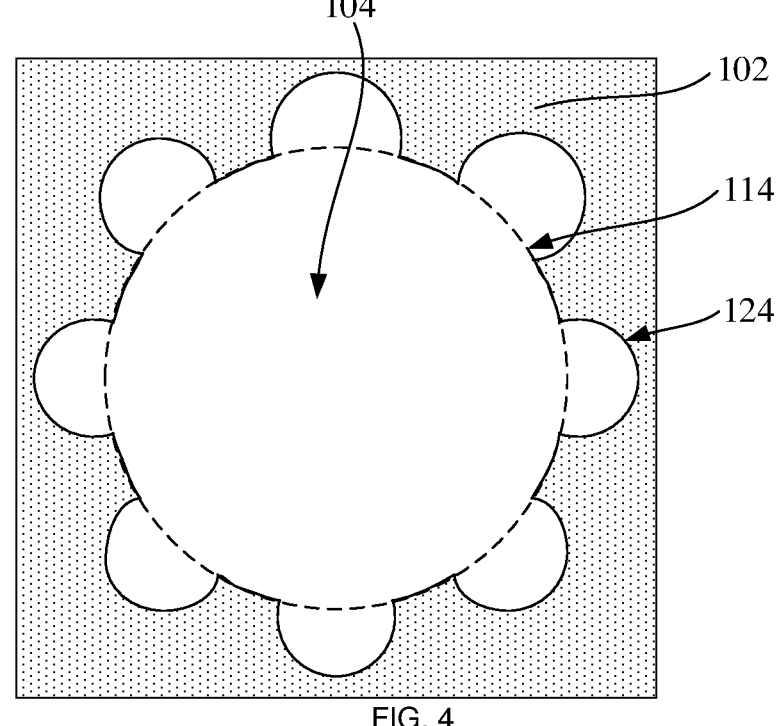
FIG. 4 is a top view of a first through hole according to a first embodiment of the present disclosure.

FIG. 1 is a top view of a semiconductor structure according to a first embodiment of the present disclosure. FIG. 2 is a stepped section view along direction II1 in FIG. 1. FIG. 3 is a stepped section view along direction JJ1 in FIG. 1. FIG. 4 is a top view of a first through hole according to a first embodiment of the present disclosure.

Referring to FIGS. 1 to 3, the semiconductor structure includes: a base 100, a magnetic core 101, a dielectric layer 102 and a solenoid-shaped metal layer 103. The base 100 is provided with a first surface a and a second surface b that are opposite to each other. The magnetic core 101 is located in the base 100, and an orthographic projection of the magnetic core 101 on the first surface a is a closed ring pattern. The dielectric layer 102 is located on the second surface b. The metal layer 103 is located in the base 100 and the dielectric layer 102, and is wound around the magnetic core 101. The metal layer 103 and the magnetic core 101 are spaced apart from each other. Part of the metal layer 103 is exposed on the first surface a, and part of the metal layer 103 is exposed on a surface of the dielectric layer 102 away from the base 100. The base 100 and the dielectric layer 102 are provided between the metal layer 103 and the magnetic core 101.

In this embodiment, the metal layer 103 is integrally formed to avoid a large contact resistance in the structure of the metal layer 103, thereby improving the overall conductivity of the metal layer 103 and improving the quality factor of the solenoid inductor. In addition, in terms of the fabrication process, the one-time formation of the metal layer 103 simplifies the fabrication step of the metal layer 103.

In this embodiment, the magnetic core 101 is provided in the base 100, and the orthographic projection of the magnetic core 101 on the first surface a of the base 100 is a closed ring pattern. The metal layer 103 is wound around the magnetic core 101. In this way, the metal layer 103 and the magnetic core 101 together form a 3D solenoid inductor in the semiconductor structure, which reduces the orthographic projection area of the solenoid inductor on the surface of the base 100. Therefore, while the solenoid inductor has a compact size, the quality factor of the solenoid inductor is improved by winding the metal layer 103 on the magnetic core 101, thereby improving the electrical performance and working efficiency of the solenoid inductor. Besides, since part of the metal layer 103 is exposed on the first surface a and part of the metal layer 103 is exposed on the surface of the dielectric layer 102 away from the base 100, the heat dissipation of the solenoid inductor is promoted. The orthographic projection of the magnetic core 101 on the first surface a is a closed circular-ring pattern. In other embodiments, the orthographic projection of the magnetic core on the first surface may also be a closed elliptical-ring pattern or a closed square-ring pattern.

The material of the magnetic core 101 may be a high-permeability material such as an iron-nickel alloy, an iron-nickel-zinc alloy or an iron-nickel-molybdenum alloy, which further increases the inductance of the solenoid inductor, thereby further improving the quality factor of the solenoid inductor.

The base 100 and the dielectric layer 102 may be made of a silicon-containing material, which may be at least one of the group consisting of silicon, silicon germanium, silicon oxide, silicon nitride, silicon oxynitride, silicon carbide, silicon carbon nitride and silicon oxycarbide. In an example, the base 100 is made of silicon, and the dielectric layer 102 is made of silicon oxide, which improves the compatibility between the formation process of the solenoid inductor and a common semiconductor fabrication process.

The metal layer 103 may be made of a metal material, which may be at least one of the group consisting of copper, silver, tungsten, titanium, gold, nickel and palladium. In an example, the metal layer 103 is made of copper. Copper has low cost and excellent conductivity. Therefore, while reducing the resistance of the metal layer 103, it avoids excessively high material cost of the metal layer 103, thereby further increasing the inductance of the solenoid inductor and avoiding excessively high fabrication cost of the solenoid inductor.

Referring to FIGS. 1 to 3, the metal layer 103 includes: multiple first metal layers 113 located in the base 100, multiple second metal layers 123 penetrating through the base 100 and the dielectric layer 102 and multiple third metal layers 133 located in the dielectric layer 102. The first metal layers 113 are located on a side of the magnetic core 101 facing the first surface a, and orthographic projections of the first metal layers 113 on the first surface a are intersected with the orthographic projection of the magnetic core 101 on the first surface a. Orthographic projections of the third metal layers 133 on the first surface a are intersected with the orthographic projection of the magnetic core 101 on the first surface a. Two ends of each of the third metal layers 133 are electrically connected to two adjacent first metal layers 113 through one of the second metal layers 123, respectively.

The base 100 is provided between the first metal layers 113 and the magnetic core 101. The base 100 and the dielectric layer 102 are provided between the second metal layers 123 and the magnetic core 101. The dielectric layer 102 is provided between the third metal layers 133 and the magnetic core 101.

The first metal layers 113 and the third metal layers 133 are respectively elongated. The width of the first metal layers 113 in a direction perpendicular to an extension direction of the first metal layers 113 is equivalent to the width of the third metal layers 133 in a direction perpendicular to an extension direction of the third metal layers 133. The orthographic projections of the second metal layers 123 on the first surface a are circular. The diameter of the second metal layers 123 is equivalent to the width of the third metal layers 133. In other embodiments, the orthographic projections of the second metal layers on the first surface may also be square or elliptical.

The distance between the first metal layers 113 and the magnetic core 101 is not less than 20 nm. In an example, the distance between the first metal layers 113 and the magnetic core 101 is 25 nm, which can reduce the parasitic capacitance between the first metal layers 113 and the magnetic core 101, thereby improving the filtering effect of the solenoid inductor and improving the working efficiency of the solenoid inductor.

In this embodiment, the distance between the second metal layers 123 and the magnetic core 101 is in the same range as the distance between the first metal layers 113 and the magnetic core 101. The distance between the third metal layers 133 and the magnetic core 101 is in the same range as the distance between the first metal layers 113 and the magnetic core 101. In an example, the distance between the second metal layers 123 and the magnetic core 101 and the distance between the third metal layers 133 and the magnetic core 101 are equivalent to that between the first metal layers 113 and the magnetic core 101, which is 25 nm. This distance can reduce the parasitic capacitance between the second metal layers 123 and the magnetic core 101 and reduce the parasitic capacitance between the third metal layers 133 and the magnetic core 101, thereby improving the filtering effect of the solenoid inductor and improving the working efficiency of the solenoid inductor.

In a direction perpendicular to the first surface a, the thickness of the first metal layer 113 is 50-400 nm. In an example, the thickness of the first metal layer 113 is 100 nm, so the resistance of the first metal layers 113 is small. This ensures that the solenoid inductor has a high quality factor, while reducing the space occupied by the solenoid inductor in the semiconductor structure, thereby improving the space utilization of the semiconductor structure, and facilitating the integration of more compact power electronic components on the same chip.

In this embodiment, in the direction perpendicular to the first surface a, the thickness of the third metal layer 133 is in the same range as the thickness of the first metal layers 113. The thickness of the second metal layers 123 in a direction perpendicular to an extension direction of the second metal layers 123 is in the same range as the thickness of the first metal layers 113. The thickness of the second metal layers 123 and the thickness of the third metal layers 133 is equivalent to the thickness of the first metal layers 113, which is 100 nm, which ensures a small resistance of the second metal layers 123 and the third metal layers 133. Similarly, while the solenoid inductor has a high quality factor, the space occupied by the solenoid inductor in the semiconductor structure is also reduced, thereby improving the space utilization of the semiconductor structure.

The distance between adjacent first metal layers 113 is not less than 10 nm. In an example, the distance between adjacent first metal layers 113 is 15 nm, which reduces the parasitic capacitance between the adjacent first metal layers 113, thereby improving the filtering effect of the solenoid inductor and improving the working efficiency of the solenoid inductor.

Referring to FIG. 1, the semiconductor structure further includes: a first through hole 104. The first through hole 104 penetrates through the base 100 and the dielectric layer 102. The first through hole 104 exposes part of the magnetic core 101 and part of the metal layer 103, and part of the magnetic core 101 and part of the metal layer 103 are in contact with the base 100 and the dielectric layer 102, such that the magnetic core 101 and the metal layer 103 are fixed in the semiconductor structure. In addition, the first through hole 104 increases the area of the solenoid inductor exposed to the air, that is, it increases the heat dissipation area of the solenoid inductor, thereby further improving the heat dissipation effect of the solenoid inductor.

A central axis of the first through hole 104 coincides with a central axis of the magnetic core 101, such that regions of the magnetic core 101 and the metal layer 103 that are fixed by the base 100 and the dielectric layer 102 are uniformly distributed in all directions. This increases the heat dissipation area of the solenoid inductor while ensuring that the magnetic core 101 and the metal layer 103 are uniformly stressed. The orthographic projection of the magnetic core

101 on the surface of the base 100 is a circular ring. Referring to FIG. 4, an orthographic projection of the first through hole 104 on the base 100 is composed of a circular pattern 114 and at least one convex pattern 124 located at an edge of the circular pattern 114 and protruding from the circular pattern 114. The diameter of the circular pattern 114 is less than the maximum diameter of the circular ring, and the convex pattern 124 protrudes from an outer edge of the circular pattern 114. In this embodiment, there are eight convex patterns 124, and the eight convex patterns are uniformly distributed around the circular pattern 114. This ensures that the magnetic core 101 and the metal layer 103 are fixed on the base 100 and the dielectric layer 102 while further increasing the heat dissipation area of the solenoid inductor, thereby further improving the heat dissipation effect of the solenoid inductor. In other embodiments, there may also be one, two or four convex patterns. It should be noted that, under the condition that the magnetic core 101 and the metal layer 103 are fixed on the base 100 and the dielectric layer 102, the number of the convex patterns 124 is not limited.

The orthographic projection of the first through hole 104 on the base 100 is an axisymmetric pattern, such that regions of the magnetic core 101 and the metal layer 103 fixed by the base 100 and the dielectric layer 102 are symmetrically distributed. This increases the heat dissipation area of the solenoid inductor while ensuring that forces from the base 100 and the dielectric layer 102 received by the magnetic core 101 and the metal layer 103 are symmetrically distributed in the magnetic core 101 and the metal layer 103.

In other embodiments, the orthographic projection of the magnetic core on the surface of the base is a circular ring. The orthographic projection of the first through hole on the base may be a circle, and the diameter of the circle is less than the maximum diameter of the circular ring.

In this embodiment, the semiconductor structure may further include: a first lead 143 and a second lead 153. The first lead 143 is electrically connected to one end of the metal layer 103, and the second lead 153 is electrically connected to the other end of the metal layer 103. In addition, the first lead 143 and the second lead 153 are integrally formed with the metal layer 103, that is, the first lead 143, the second lead 153 and the metal layer 103 may be formed for one time. This avoids a contact resistance between the first lead 143 and the second lead 153 and the metal layer 103, thereby improving the conductivity between the first lead 143 and the second lead 153 and the metal layer 103.

Referring to FIGS. 1 to 3, the first lead 143 is electrically connected to a third metal layer 133, and the second lead 153 is electrically connected to a second metal layer 123. In other embodiments, the first lead and the second lead may not be integrally formed with the metal layer. The first lead may be electrically connected to a second metal layer or a first metal layer, and the second lead may be electrically connected to a third metal is layer or a first metal layer.

In summary, in the semiconductor structure provided by the first embodiment of the present disclosure, the metal layer 103 is wound around the magnetic core 101, and the metal layer 103 and the magnetic core 101 together form a 3D solenoid inductor in the semiconductor structure. The solenoid inductor has a small orthographic projection area on the surface of the base 100. Since the magnetic core 101 increases the magnetic permeability of the solenoid inductor, the physical size of the solenoid inductor is compacted while the quality factor of the solenoid inductor is improved, which reduces the space occupied by the solenoid inductor in the semiconductor structure. In addition, part of the metal layer 103 is exposed on the first surface a of the base 100, part of the metal layer 103 is exposed on the surface of the dielectric layer 102 away from the base 100, and part of the magnetic core 101 and part of the metal layer 103 are exposed by the first through hole 104. This ensures that the magnetic core 101 and the metal layer 103 are fixed on the base 100 and the dielectric layer 102 while further increasing the heat dissipation area of the solenoid inductor, thereby further improving the heat dissipation effect of the solenoid inductor.

Figure 5:
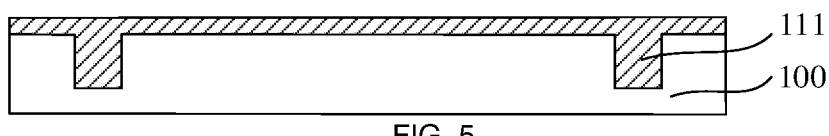
FIG. 5 is a view illustrating a structure obtained by depositing a metal material layer is on a first surface of a base and in a trench.
Figure 6:
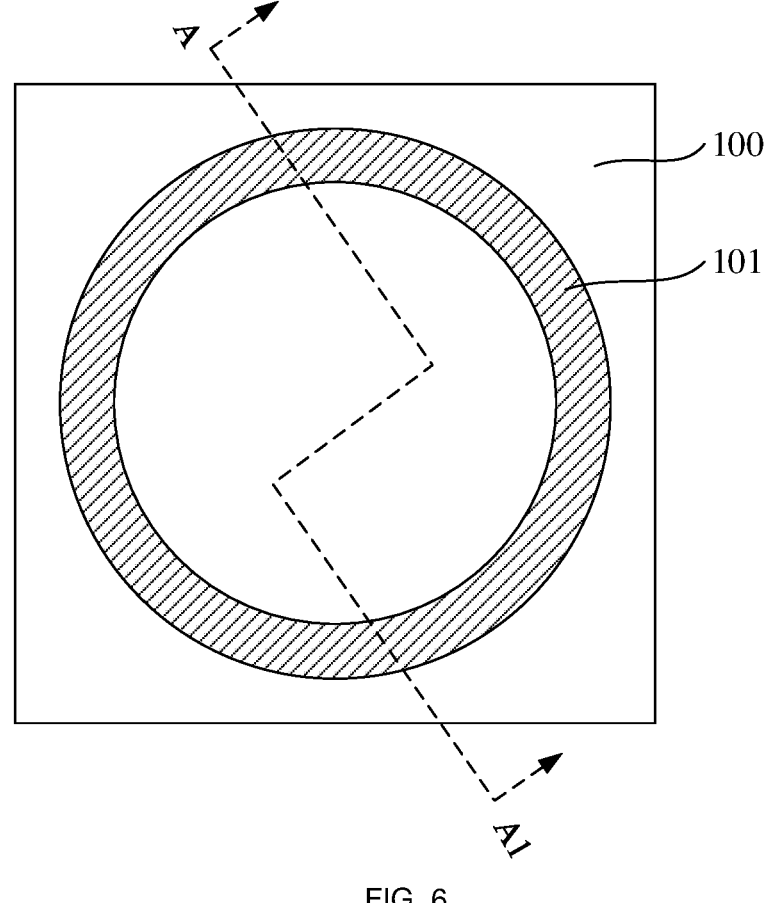
FIG. 6 is a top view illustrating a structure obtained by forming a magnetic core by planarizing the structure shown in FIG. 5.
Figure 7:
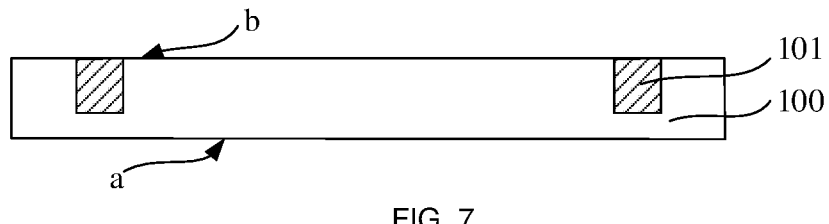
FIG. 7 is a stepped section view along direction AA1 in FIG. 6.
Figure 20:
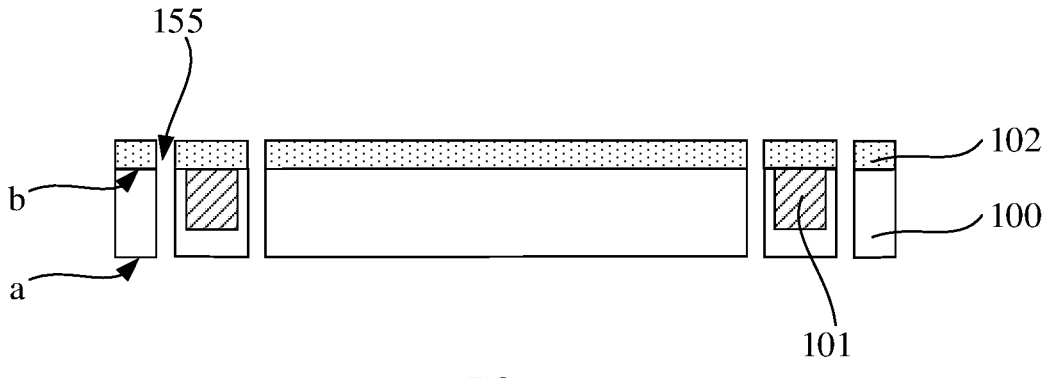
FIG. 20 is a view illustrating a structure obtained by forming multiple through holes according to an embodiment of the present disclosure.
Figure 21:
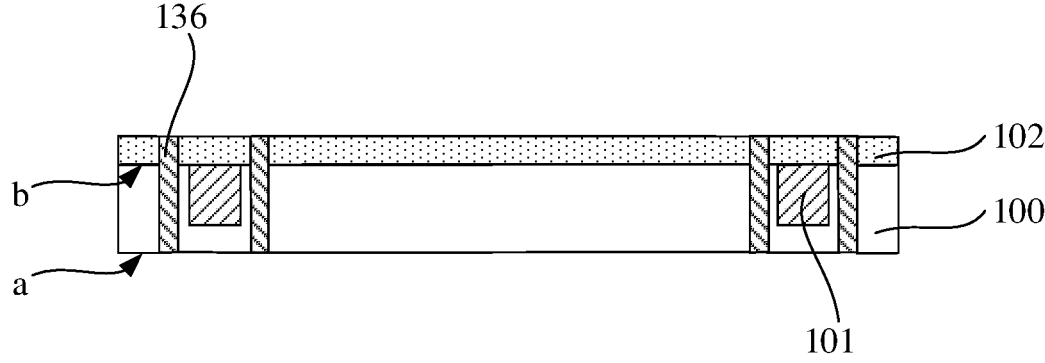
FIG. 21 is a view illustrating a structure obtained by forming a third filling layer in the through holes in the structure shown in FIG. 20.
Figure 22:
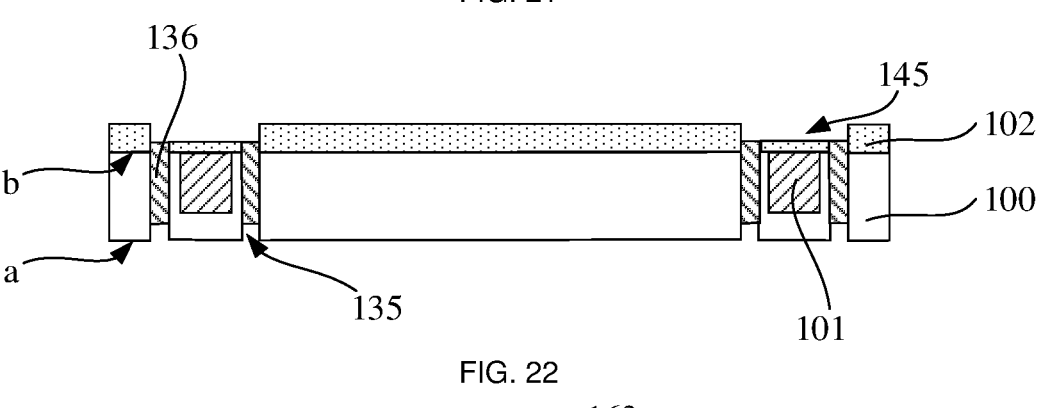
FIG. 22 is a view illustrating a structure obtained by forming multiple first grooves and second grooves in the structure shown in FIG. 21.
Figure 23:
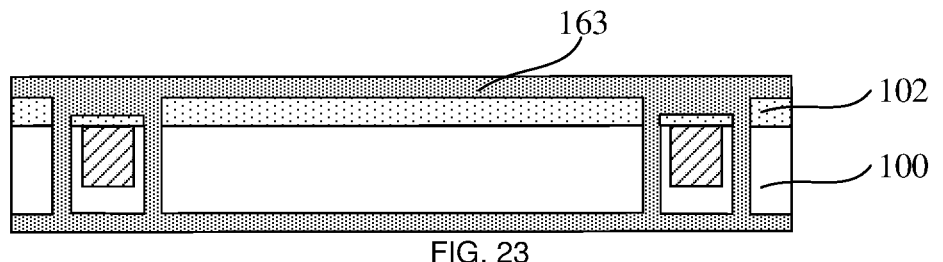
FIG. 23 is a view illustrating a structure obtained by forming a base metal layer in the structure shown in FIG. 22.
Figure 24:
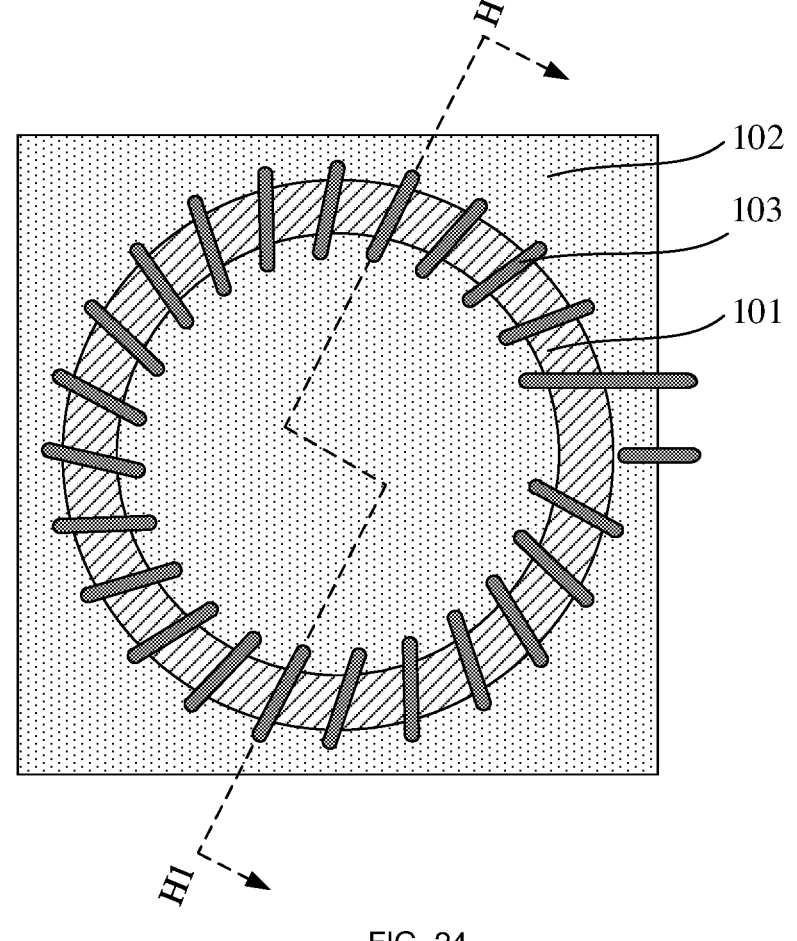
FIG. 24 is a top view illustrating a structure obtained by forming a metal layer in the structure shown in FIG. 23.
Figure 25:
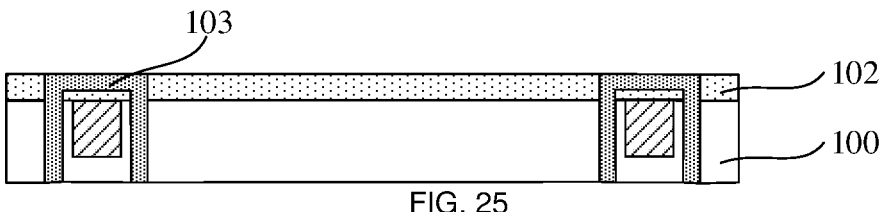
FIG. 25 is a stepped section view along direction HH1 in FIG. 24.

A second embodiment of the present disclosure further provides a method of fabricating a semiconductor structure, which is used to fabricate the above-mentioned semiconductor structure. FIGS. 5 to 7 illustrate structures obtained by implementing various steps of a method for forming a magnetic core according to the second embodiment of the present disclosure. FIGS. 8 to 19 illustrate structures obtained by implementing various steps of a method for forming a continuous trench according to the second embodiment of the present disclosure. FIGS. 20 to 22 illustrate structures obtained by implementing various steps of another method for forming a continuous trench according to the second embodiment of the present disclosure. FIGS. 23 to 25 illustrate structures obtained by implementing various steps of a method for forming a metal layer according to the second embodiment of the present disclosure.

Referring to FIGS. 5 to 7, FIG. 7 is a stepped section view along direction AA1 in FIG. 6. A base 100 is provided. The base 100 is provided with a first surface a and a second surface b that are opposite to each other, and the base 100 is provided with a magnetic core 101 therein. An orthographic projection of the magnetic core 101 on the first surface a is a closed ring pattern.

The magnetic core 101 is formed as follows:

The second surface b is etched to form a trench, where an orthographic projection of the trench on the first surface a is a closed ring pattern. A metal material layer 111 is deposited in the trench and on the second surface b. The metal material layer 111 is planarized until the surface of the base 100 is exposed, so as to form the magnetic core 101. The process of planarization includes chemical mechanical polishing (CMP).

In this embodiment, the method of forming the trench includes pattern-dry etching. In addition, the method of depositing the metal material layer 111 includes physical vapor deposition (PVD) (for example, sputtering, etc.), chemical vapor deposition (CVD) or spraying. The metal material layer 111 may be a high-permeability material such as an iron-nickel alloy, an iron-nickel-zinc alloy or an iron-nickel-molybdenum alloy.

Figure 18:
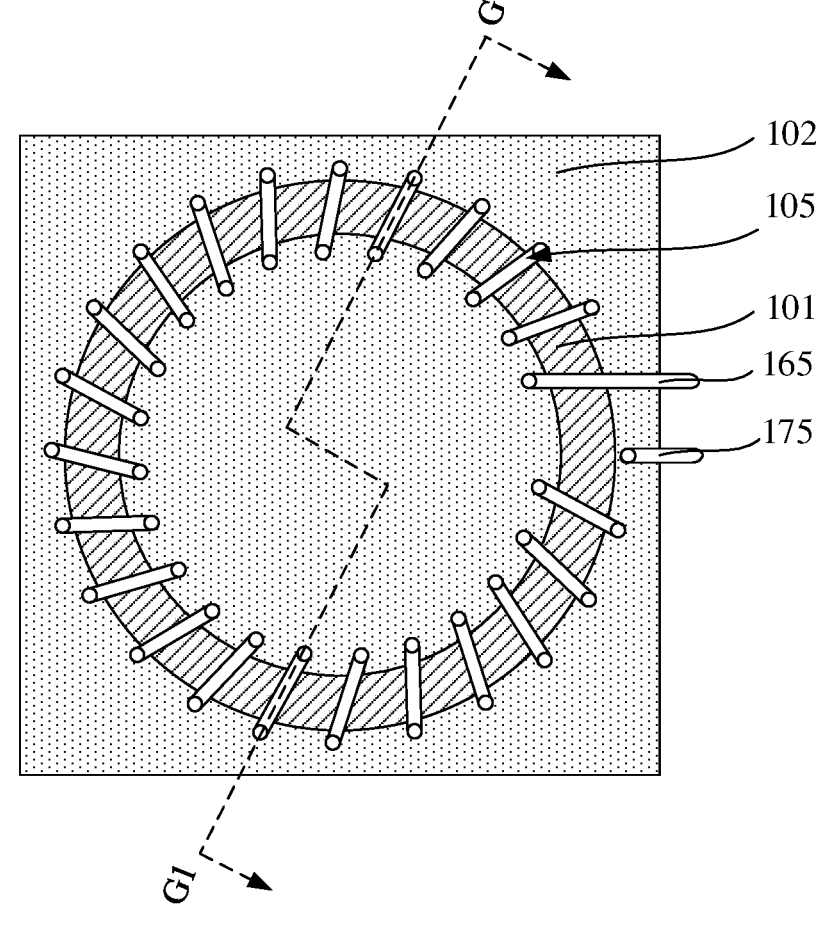
FIG. 18 is a top view of a structure obtained by forming a continuous trench in the structure shown in FIG. 15.
Figure 19:
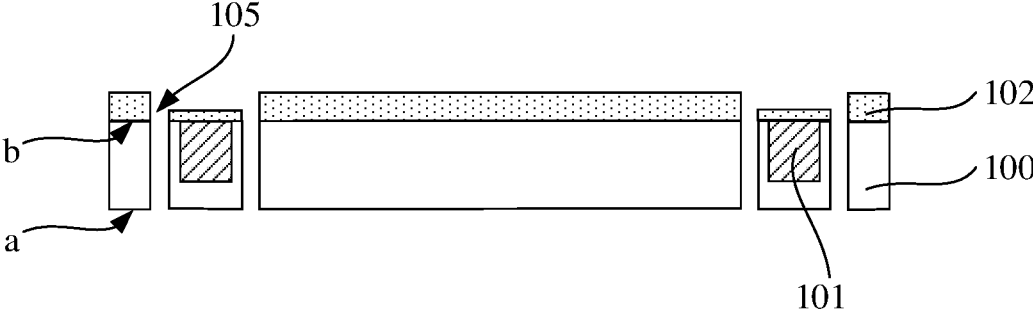
FIG. 19 is a stepped section view along direction GG1 in FIG. 18.

Referring to FIG. 18 and FIG. 19, a solenoid-shaped continuous trench 105 is formed in the base 100 and the dielectric layer 102. The continuous trench 105 is wound around the magnetic core 101, and the continuous trench 105 and the magnetic core 101 are spaced apart from each other. Part of the continuous trench 105 is exposed on the first surface a, and part of the continuous trench 105 is exposed on the surface of the dielectric layer 102 away from the base 100.

Figure 8:
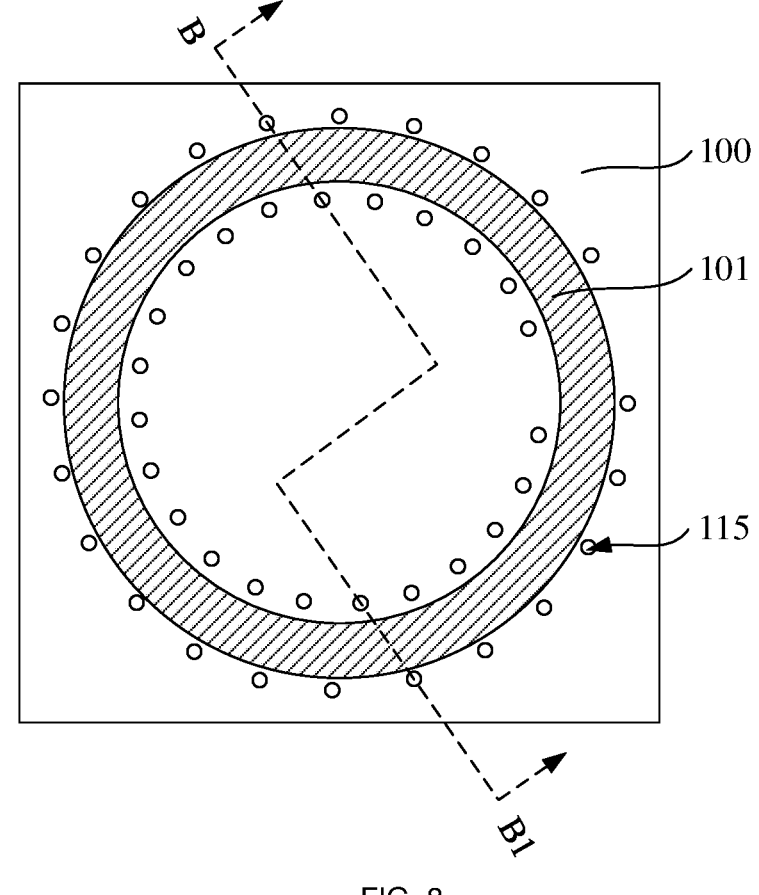
FIG. 8 is a top view illustrating a structure obtained by forming multiple second through holes in the base in the structure shown in FIG. 6.
Figure 9:
FIG. 9 is a stepped section view along direction BB1 in FIG. 8.

In an example, after the magnetic core 101 is formed in the base 100, before the dielectric layer 102 is formed on the second surface b of the base 100, a partial region of the continuous trench 105 is formed in the base 100. Then the dielectric layer is formed on the second surface b of the base 100, and the remaining region of the continuous trench 105 is formed in the dielectric layer 102. The continuous trench 105 is formed as follows:

Referring to FIGS. 8 and 9, FIG. 9 is a stepped section view along direction BB1 in FIG. 8. The base 100 is etched to form multiple second through holes 115, where the second through holes 115 penetrate through the base 100, and the second through holes 115 are located on two opposite sides of the magnetic core 101. The orthographic projection of the magnetic core 101 on the first surface is a closed ring pattern. Orthographic projections of part of the second through holes 115 on the first surface are located in a region enclosed by the closed ring pattern, and orthographic projections of the remaining second through holes 115 on the first surface a are located outside the region enclosed by the closed ring pattern.

In this embodiment, the method for forming the second through holes 115 includes pattern-dry etching. If the thickness of the base 100 is large in a direction perpendicular to the first surface a, the base 100 may be etched by a deep reactive-ion etching (DRIE) process to form the second through holes 115. In other embodiments, other dry etching processes may also be used to etch the base to form the second through holes.

Figure 10:
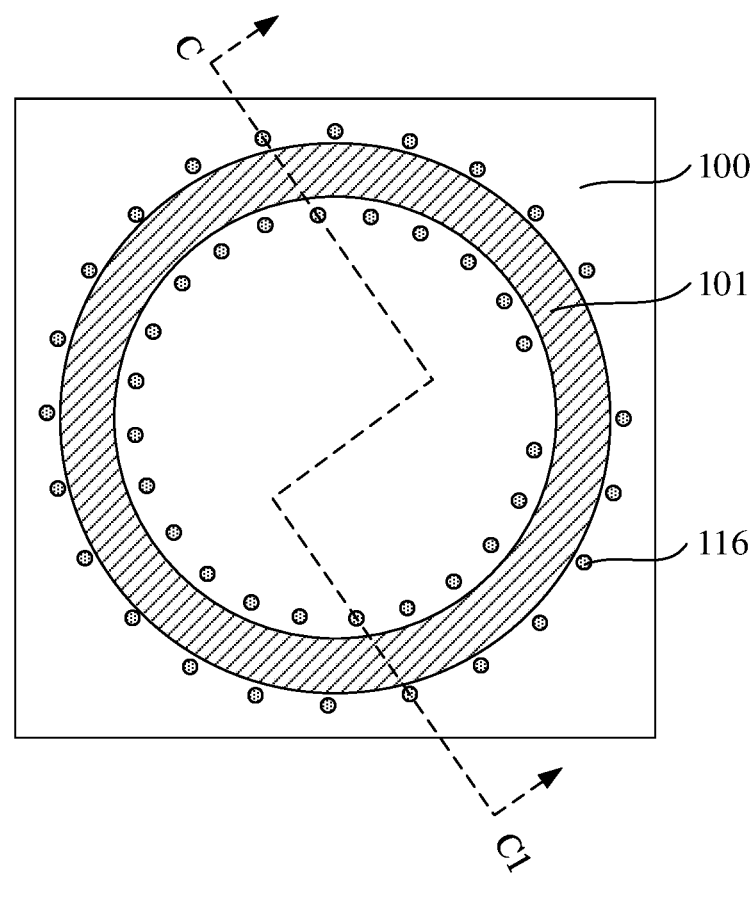
FIG. 10 is a top view illustrating a structure obtained by forming a first filling layer in the second through holes in the structure shown in FIG. 8.
Figure 11:
FIG. 11 is a stepped section view along direction CC1 in FIG. 10.

Referring to FIGS. 10 and 11, FIG. 11 is a stepped section view along direction CC1 in FIG. 10. A first filling layer 116 is formed in the second through holes 115 to prevent a dielectric layer from being formed in the second through holes 115 when the dielectric layer is subsequently formed on the second surface of the base 100, which will hinder subsequent impurity removal of the second through holes 115.

Figure 12:
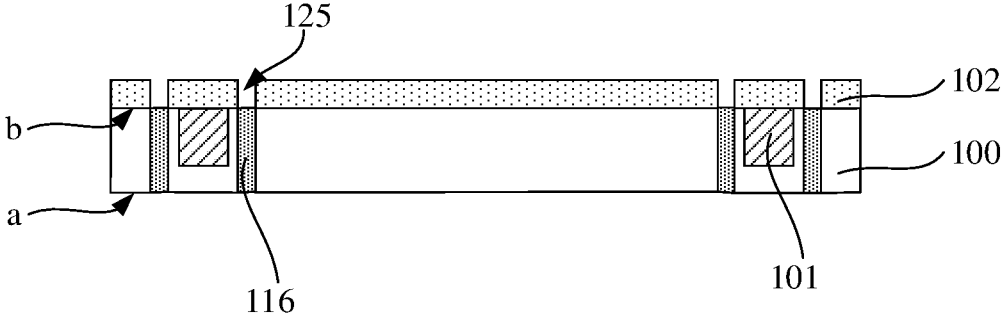
FIG. 12 is a view illustrating a structure obtained by forming multiple third through holes in a dielectric layer on a second surface of the base in the structure shown in FIG. 11.
Figure 13:
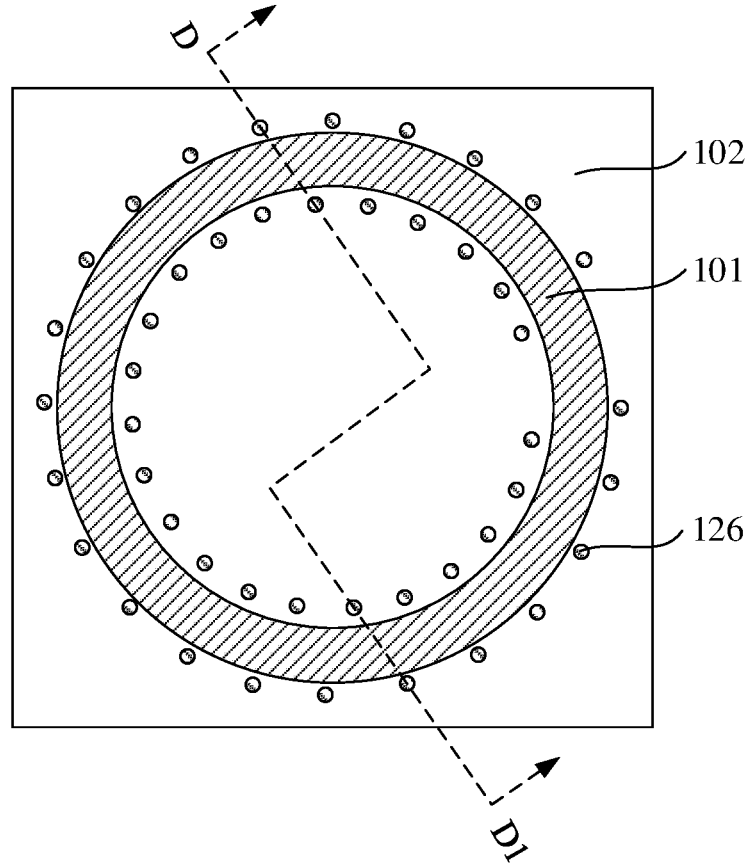
FIG. 13 is a top view illustrating a structure obtained by forming a second filling layer in the third through holes in the structure shown in FIG. 12.
Figure 14:
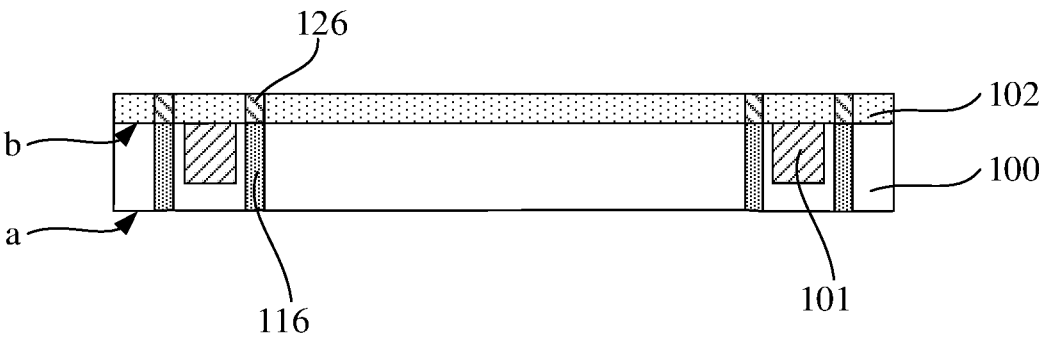
FIG. 14 is a stepped section view along direction DD1 in FIG. 13.

Referring to FIGS. 12 to 14, FIG. 14 is a stepped section view along direction DD1 in FIG. 13. Referring to FIG. 12, the dielectric layer 102 is formed on the second surface b, and the dielectric layer 102 is etched to form multiple third through holes 125. The third through holes 125 penetrate through the dielectric layer 102 and expose the first filling layer 116.

Referring to FIGS. 13 and 14, a second filling layer 126 is formed in the third through holes 125.

Figure 15:
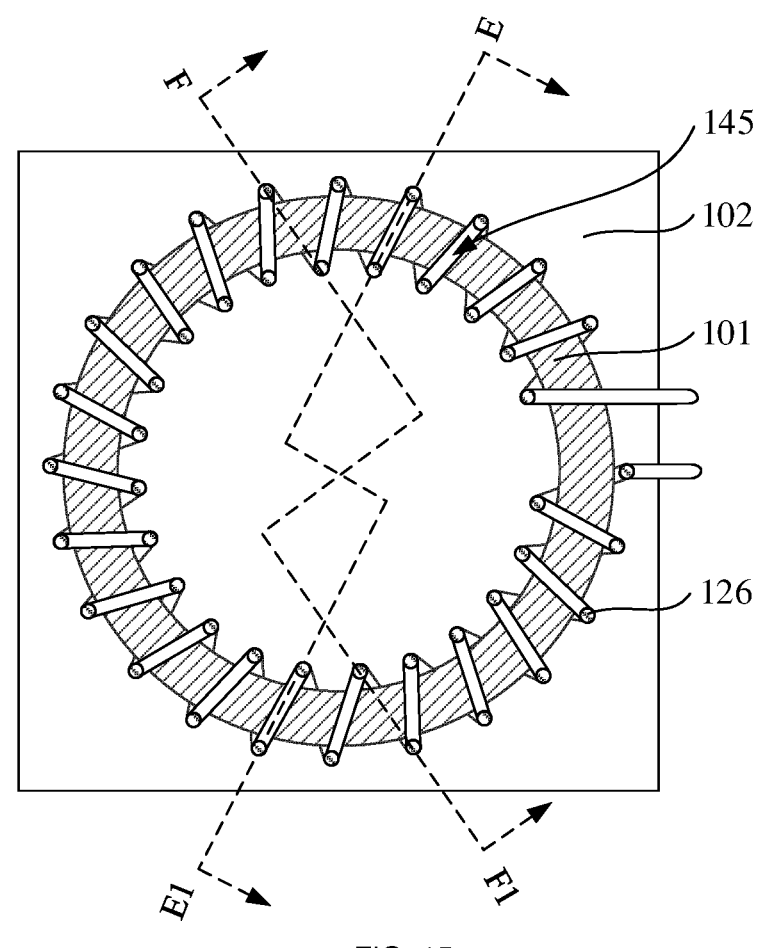
FIG. 15 is a top view illustrating a structure obtained by forming multiple first grooves and second grooves in the structure shown in FIG. 13.
Figure 16:
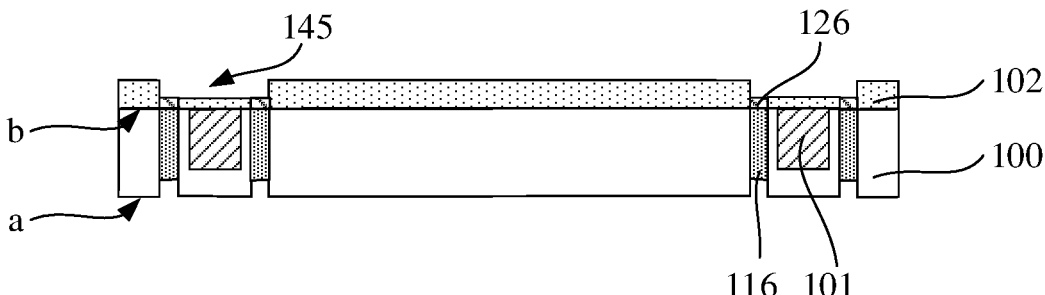
FIG. 16 is a stepped section view along direction EE1 in FIG. 15.
Figure 17:
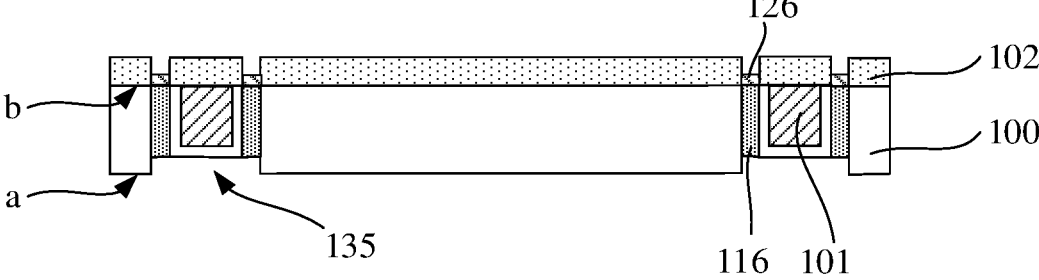
FIG. 17 is a stepped section view along direction FF1 in FIG. 15.

Referring to FIGS. 15 to 17, FIG. 16 is a stepped section view along direction EE1 in FIG. 15, and FIG. 17 is a stepped section view along direction FF1 in FIG. 15. The first surface a is etched to form multiple first grooves 135, and two ends of each of the first grooves 135 expose the first filling layer 116. A side of the dielectric layer 102 away from the base 100 is etched to form multiple second grooves 145, and two ends of each of the second grooves 145 expose the second filling layer 126.

In this embodiment, when the first grooves 135 are formed, part of the first filling layer 116 is etched while the first surface a is etched. When the second grooves 145 are formed, the side of the dielectric layer 102 away from the base 100 is etched while the second is filling layer 126 is etched. In this way, after the first filling layer 116 and the second filling layer 126 are subsequently removed, the first grooves 135 and the second grooves 145 are communicated through the second through holes 115 and the third through holes 125 within a certain process error range. Therefore, the continuous trench 105 formed by the second through holes 115, the third through holes 125, the first grooves 135 and the second grooves 145 has desirable connectivity, thereby ensuring the desirable conductivity of the metal layer formed in the continuous trench 105 subsequently.

Referring to FIGS. 18 and 19, FIG. 19 is a stepped section view along direction GG1 in FIG. 18. The first filling layer 116 and the second filling layer 126 are removed, and the second through holes 115, the third through holes 125, the first grooves 135 and the second grooves 145 together form the continuous trench 105.

In this embodiment, the materials of the first filling layer 116 and the second filling layer 126 are the same, which facilitates subsequent removal of the first filling layer 116 and the second filling layer 126 together. The first filling layer 116 and the second filling layer 126 are made of an organic compound, and the first filling layer 116 and the second filling layer 126 can be removed simultaneously by an ashing process. Oxygen is introduced into a chamber, and relevant internal parameters of the chamber are controlled, such that the first filling layer 116 and the second filling layer 126 react with oxygen to generate gas, so as to remove the first filling layer 116 and the second filling layer 126.

In another example, after the magnetic core 101 is formed in the base 100, the dielectric layer 102 is first formed on the second surface b of the base 100, and then the base 100 and the dielectric layer 102 are etched to form the continuous trench 105. The continuous trench 105 is formed as follows:

Referring to FIG. 20, the base 100 and the dielectric layer 102 are etched to form multiple through holes 155. The through holes 155 penetrate through the base 100 and the dielectric layer 102, and the through holes 155 are located on two sides of the magnetic core 101.

Referring to FIG. 21, a third filling layer 136 is formed in the through holes 155. In a subsequent step of etching the base 100 and the dielectric layer 102, a photoresist is applied to the first surface a of the base 100 and the side of the dielectric layer 102 away from the base 100. Since the dielectric layer 102 and the third filling layer 136 jointly form a flat surface, the photoresist is coated uniformly, and defocusing is avoided during subsequent photolithography. In addition, the third filling layer 136 is made of an organic compound.

Referring to FIG. 22, the first surface a of the base 100 is etched to form multiple first grooves 135, the side of the dielectric layer 102 away from the base 100 is etched to form multiple second grooves 145, and the third filling layer 136 is removed. The second grooves 145 are respectively communicated with two adjacent first grooves 135 through the through holes 155 (refer to FIG. 20). The multiple first grooves 135, the multiple through holes 155 and the multiple second grooves 145 form the continuous trench 105.

In this embodiment, when the first grooves 135 are formed, part of the third filling layer 136 is etched while the first surface a is etched. When the second grooves 145 are formed, the side of the dielectric layer 102 away from the base 100 is etched while the third filling layer 136 is etched. In this way, after the third filling layer 136 is subsequently removed, the first grooves 135 and the second grooves 145 are communicated through the through holes 155 within a certain process error range. Therefore, the continuous trench 105 formed by the through holes 155, the first grooves 135 and the second grooves 145 has desirable connectivity, thereby ensuring the desirable conductivity of the metal layer formed in the continuous trench 105 subsequently.

In this embodiment, the first grooves 135 and the second grooves 145 are formed as follows:

A first mask layer with a first mask pattern is formed on the first surface a. In this embodiment, the first mask layer is a photoresist treated by light and a developer. Then, the first surface a is etched by using the first mask layer as a mask to form multiple first grooves 135. A second mask layer with a second mask pattern is formed on the side of the dielectric layer 102 away from the base 100, where the material of the second mask layer is the same as the material of the first mask layer. The dielectric layer 102 is etched by using the second mask layer as a mask to form multiple second grooves 145. Finally, the first mask layer and the second mask layer are removed.

In this embodiment, the first mask layer, the second mask layer and the third filling layer 136 may be removed by an etching process or an ashing process. In an example, when the materials of the first mask layer, the second mask layer and the third filling layer 136 are respectively a photoresist, the first mask layer, the second mask layer and a third filling layer 136 may be removed simultaneously by an ashing process. Oxygen is introduced into a chamber, and relevant internal parameters of the chamber are controlled, such that the first mask layer, the second mask layer and the third filling layer 136 react with the oxygen to generate gas, so as to remove the first mask layer, the second mask layer and the third filling layer 136.

In other embodiments, the through holes may be formed first, and then the first grooves and the second grooves are formed. Alternatively, at least the first grooves or the second grooves are formed first, and then the through holes are formed.

In addition, referring to FIG. 18, in this embodiment, when the dielectric layer 102 is etched with the second mask layer as a mask to form the multiple second grooves 145, a third groove 165 and a fourth groove 175 are also formed. The third groove 165 is communicated with a second groove 145, and the fourth groove 175 is communicated with a through hole 155. In an example, the fourth groove 175 is communicated with a through hole 155 adjacent to a third groove 165. When the metal layer is subsequently formed in the continuous trench 105, a first lead is formed in the third groove 165, and a second lead is formed in the fourth groove 175. Since the first lead, the second lead and the metal layer are formed simultaneously, the first lead, the second lead and the metal layer are integrally formed. This can avoid a contact resistance between the first lead and the second lead and the metal layer, thereby improving the conductivity between the first lead and the second lead and the metal layer. In other embodiments, when the base is etched to form the first grooves, at least the third groove or the fourth groove may also be formed. Alternatively, after the metal layer is formed, the third groove and the fourth groove are formed.

Referring to FIGS. 23 to 25, FIG. 25 is a stepped section view along direction HH1 in FIG. 24. The metal layer 103 is formed in the continuous trench 105.

Referring to FIG. 23, the semiconductor structure with the continuous trench 105 is immersed in a reaction solution for electroplating to form a base metal layer 163 in the continuous trench 105, on the surface of the dielectric layer 102 and on the surface of the base 100 (refer to FIG. 19). Before the base metal layer 163 is formed, an electroplating seed layer is deposited in the continuous trench 105, on the surface of the dielectric layer 102 and on the surface of the base 100. In this way, when the semiconductor structure is subsequently electroplated, the base metal layer 163 is formed in the continuous trench 105, on the surface of the dielectric layer 102 and on the surface of the base 100, respectively. In this embodiment, the method for depositing the first electroplating seed layer includes PVD (for example, sputtering, etc.), CVD, inkjet printing, printing, spraying or chemical plating, etc. The reaction solution may be a copper sulfate solution or a silver sulfate solution.

Referring to FIGS. 24 and 25, the base metal layer 163 (refer to FIG. 23) is planarized to remove the base metal layer 163 on the surface of the dielectric layer 102 and the surface of the base 100, so as to form the metal layer 103.

The method of fabricating the semiconductor structure provided by the second embodiment of the present disclosure further includes: etch the dielectric layer 102 and the base 100 to form a first through hole. The first through hole penetrates through the base 100 and the dielectric layer 102, and the first through hole exposes part of the magnetic core 101 and part of the metal layer 103. This increases the area of the solenoid inductor exposed to the air, that is, it increases the heat dissipation area of the solenoid inductor, thereby further improving the heat dissipation effect of the solenoid inductor.

In the fabrication method provided by the second embodiment of the present disclosure, the solenoid-shaped metal layer 103 is formed in the base 100 and the dielectric layer 102, the magnetic core 101 is formed in the base 100, and the metal layer 103 is wound around the magnetic core 101. Under the action of the magnetic core 101, the magnetic permeability of the solenoid inductor is increased, and the inductance of the solenoid inductor is increased, thereby improving the electrical performance of the solenoid inductor. In addition, the dielectric layer 102 and the base 100 are etched to form the first through hole, such that part of the magnetic core 101 and part of the metal layer 103 are exposed to the air, so as to ensure a desirable heat dissipation effect of the solenoid inductor.

Each embodiment or implementation in the specification of the present disclosure is described in a progressive manner. Each embodiment focuses on the difference from other embodiments, and the same and similar parts between the embodiments may refer to each other.

In the description of the specification, the description with reference to terms such as "an embodiment", "an illustrative embodiment", "some implementations", "an illustrative implementation" and "an example" means that the specific feature, structure, material or feature described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned device or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the semiconductor structure and the fabrication method thereof provided by the embodiments of the present disclosure, the magnetic core is provided in the base, and the orthographic projection of the magnetic core on the first surface of the base is a closed ring pattern. The metal layer is provided in the dielectric layer on the second surface of the base and in the base, and the metal layer is wound around the magnetic core. In this way, the metal layer and the magnetic core together form a 3D solenoid inductor in the semiconductor structure, which reduces the orthographic projection area of the solenoid inductor on the surface of the base. Therefore, while the solenoid inductor has a compact size, the quality factor of the solenoid inductor is improved by winding the metal layer on the magnetic core, thereby improving the electrical performance and working efficiency of the solenoid inductor. Besides, when the solenoid inductor is operated at a high frequency, the metal layer itself generates heat due to the heating effect of the current. Since part of the metal layer is exposed on the first surface of the base and part of the metal layer is exposed on the surface of the dielectric layer away from the base, part of the metal layer is exposed to the air, thereby ensuring a desirable heat dissipation effect of the solenoid inductor. In addition, the magnetic core is formed in the base. The solenoid-shaped metal layer is formed in the base and the dielectric layer, and the metal is layer is wound around the magnetic core. Under the action of the magnetic core, the magnetic permeability of the solenoid inductor is increased, and the inductance of the solenoid inductor is increased, thereby improving the electrical performance of the solenoid inductor. The method for forming a semiconductor structure provided by the embodiment of the present disclosure is highly compatible with the semiconductor fabrication process.

The invention claimed is:

1. A semiconductor structure, comprising:

a base, wherein the base is provided with a first surface and a second surface that are opposite to each other;

a magnetic core, wherein the magnetic core is located in the base, and an orthographic projection of the magnetic core on the first surface is a closed ring pattern;

a dielectric layer, wherein the dielectric layer is located on the second surface; and a solenoid-shaped metal layer, wherein the metal layer is located in the base and the dielectric layer and is wound around the magnetic core; the metal layer and the magnetic core are spaced apart from each other; part of the metal layer is exposed on the first surface; and part of the metal layer is exposed on a surface of the dielectric layer away from the base;

a first through hole; the first through hole penetrates through the base and the dielectric layer; and the first through hole exposes part of the magnetic core and part of the metal layer.

2. The semiconductor structure according to claim 1, wherein the metal layer comprises: multiple first metal layers located in the base, wherein the first metal layers are located on a side of the magnetic core facing the first surface, and orthographic projections of the first metal layers on the first surface are intersected with the orthographic projection of the magnetic core on the first surface; multiple second metal layers penetrating through the base and the dielectric layer; and multiple third metal layers located in the dielectric layer, wherein orthographic projections of the third metal layers on the first surface are intersected with the orthographic projection of the magnetic core on the first surface; and two ends of each of the third metal layers are electrically connected to two adjacent first metal layers through one of the second metal layers, respectively.

3. The semiconductor structure according to claim 2, wherein a distance between the second metal layers and the magnetic core is in a same range as a distance between the first metal layers and the magnetic core; and a distance between the third metal layers and the magnetic core is in a same range as a distance between the first metal layers and the magnetic core.

4. The semiconductor structure according to claim 2, wherein in a direction perpendicular to a surface of the base, a thickness of the third metal layers is in a same range as a thickness of the first metal layers; and a thickness of the second metal layers in a direction perpendicular to an extension direction of the second metal layers is in the same range as the thickness of the first metal layers.

5. The semiconductor structure according to claim 1, wherein a central axis of the first through hole coincides with a central axis of the magnetic core.

6. The semiconductor structure according to claim 5, wherein the orthographic projection of the magnetic core on the surface of the base is a circular ring; an orthographic projection of the first through hole on the base is composed of a circular pattern and at least one convex pattern located at an edge of the circular pattern and protruding from the circular pattern; a diameter of the circular pattern is less than a maximum diameter of the circular ring; and the convex pattern protrudes from an outer edge of the circular pattern.

7. The semiconductor structure according to claim 6, wherein the orthographic projection of the first through hole on the base is an axisymmetric pattern.

* * * * *